US011058008B2

(12) United States Patent
Komiyama et al.

(10) Patent No.: US 11,058,008 B2
(45) Date of Patent: Jul. 6, 2021

(54) PCB PANEL, PCB, AND MANUFACTURING METHOD

(71) Applicant: LENOVO (Singapore) PTE. LTD., New Tech Park (SG)

(72) Inventors: Hirohide Komiyama, Yokohama (JP); Seiji Yamasaki, Yokohama (JP); Hua Wang, ShangHai (CN); Yanping Zhou, Shenzhen (CN)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 16/574,985

(22) Filed: Sep. 18, 2019

(65) Prior Publication Data

US 2020/0113062 A1    Apr. 9, 2020

(30) Foreign Application Priority Data

Sep. 18, 2018    (JP) .............................. JP2018-173324

(51) Int. Cl.
*H05K 1/18* (2006.01)
*H05K 3/00* (2006.01)
*H05K 3/34* (2006.01)

(52) U.S. Cl.
CPC .......... *H05K 3/0052* (2013.01); *H05K 1/181* (2013.01); *H05K 1/182* (2013.01); *H05K 3/3436* (2013.01); *H05K 2201/09072* (2013.01); *H05K 2201/10515* (2013.01)

(58) Field of Classification Search
CPC ...... H05K 3/0052; H05K 1/182; H05K 1/181; H05K 3/3436; H05K 2201/09072; H05K 2201/10515
See application file for complete search history.

(56) References Cited

U.S. PATENT DOCUMENTS

| 4,689,103 A * | 8/1987 | Elarde ................. H05K 3/0097 156/242 |
| 6,573,028 B1 * | 6/2003 | Yamamoto .......... H01L 23/3121 430/311 |
| 2005/0055814 A1 * | 3/2005 | Hatanaka ............. H03H 9/0552 29/25.35 |
| 2008/0174006 A1 * | 7/2008 | Fuchinoue .......... H01L 21/4817 257/704 |
| 2009/0200648 A1 * | 8/2009 | Graves, Jr. ............. H01L 24/50 257/659 |
| 2011/0315439 A1 * | 12/2011 | Nakashima .......... H05K 3/0052 174/260 |

(Continued)

FOREIGN PATENT DOCUMENTS

JP        2010283074 A    12/2010

*Primary Examiner* — Steven T Sawyer
(74) *Attorney, Agent, or Firm* — Kunzler Bean & Adamson

(57) ABSTRACT

A manufacturing method, Printed Circuit Board (PCB) panel, and a PCB are disclosed. The method includes forming a cavity in a PCB that is in a PCB panel that includes a frame and stays, mounting an electronic component, heating the PCB panel, and cutting the stays. The PCB panel includes a frame body and a PCB coupled to the frame body via stays. The PCB includes a cavity. A first cavity stay is located near the cavity. Extended lines extend from the cavity, and the cavity stay extends at least between the extended lines. The PCB includes a cavity and a connection point from a cavity stay near the cavity.

20 Claims, 7 Drawing Sheets

(56) References Cited

U.S. PATENT DOCUMENTS

| | | | | |
|---|---|---|---|---|
| 2013/0183475 A1* | 7/2013 | Yoshida | ................... | B32B 3/30 |
| | | | | 428/43 |
| 2013/0271924 A1* | 10/2013 | Shen | ...................... | H05K 1/181 |
| | | | | 361/728 |
| 2014/0084452 A1* | 3/2014 | Nagamatsu | ........... | H01L 21/561 |
| | | | | 257/734 |
| 2014/0126157 A1* | 5/2014 | Sawatari | ................. | H01L 24/97 |
| | | | | 361/728 |
| 2014/0174803 A1* | 6/2014 | Suzuki | ................ | H05K 3/0052 |
| | | | | 174/258 |
| 2015/0083471 A1* | 3/2015 | Ishihara | ............... | H05K 3/0097 |
| | | | | 174/255 |
| 2016/0165731 A1* | 6/2016 | Hurwitz | ................... | H05K 1/09 |
| | | | | 361/761 |
| 2018/0270957 A1* | 9/2018 | Swaminathan | ........ | H05K 1/113 |
| 2018/0310401 A1* | 10/2018 | Sugiyama | ............... | H05K 1/05 |

\* cited by examiner

US 11,058,008 B2

PCB PANEL, PCB, AND MANUFACTURING METHOD

CROSS-REFERENCE TO RELATED APPLICATIONS

This patent application claims priority to Japan Patent Application No. JP2018-173324 filed on 18 Sep. 2018 for Hirohide Komiyama, Seiji Yamasaki, Hua Wang, and Yanping Zhou, the entire contents of which are incorporated herein by reference for all purposes.

FIELD

The present invention relates to a panel, a PCB (Printed Circuit Board), and a manufacturing method for a PCB.

BACKGROUND

There has been a demand for making PCBs smaller and thinner. Hence, there are cases where the surface of a high component mounting section is provided with a cavity. Such a cavity reduces the component protrusion height from the surface of a PCB, thus reducing the thickness. However, during the heating process to solder the component to the PCB, the PCB can be damaged. Also, when the stays are cut off of the PCB, the PCB may become deformed, breaking electrical connections.

BRIEF SUMMARY

A manufacturing method for a (printed circuit board) PCB comprises forming a cavity in a PCB located in a PCB panel that comprises a frame body and a plurality of stays; mounting an electronic component in the cavity of the PCB; heating the PCB panel to reflow solder the electronic component to the PCB; and cutting the stays to free the PCB from the PCB panel; wherein the plurality of stays includes a first cavity stay located near the cavity, the first cavity stay includes extended lines that extend out from ends of the cavity, and the first cavity stay extends at least between the extended lines.

A printed circuit board (PCB) panel comprises a frame body; and a PCB that is coupled to the frame body via a plurality of stays, the PCB comprising a cavity formed in a surface of the PCB; wherein the plurality of stays includes a first cavity stay located near the cavity, the first cavity stay includes extended lines that extend out from ends of the cavity, and the first cavity stay extends at least between the extended lines.

A printed circuit board (PCB) comprises a cavity formed in a surface of the PCB; and a connection point from a first cavity stay of a PCB panel, the first cavity stay being located near the cavity; wherein the connection point is located on a first side surface of the PCB near the cavity, and the connection point extends at least between extended lines that extend out from ends of the cavity.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 8:
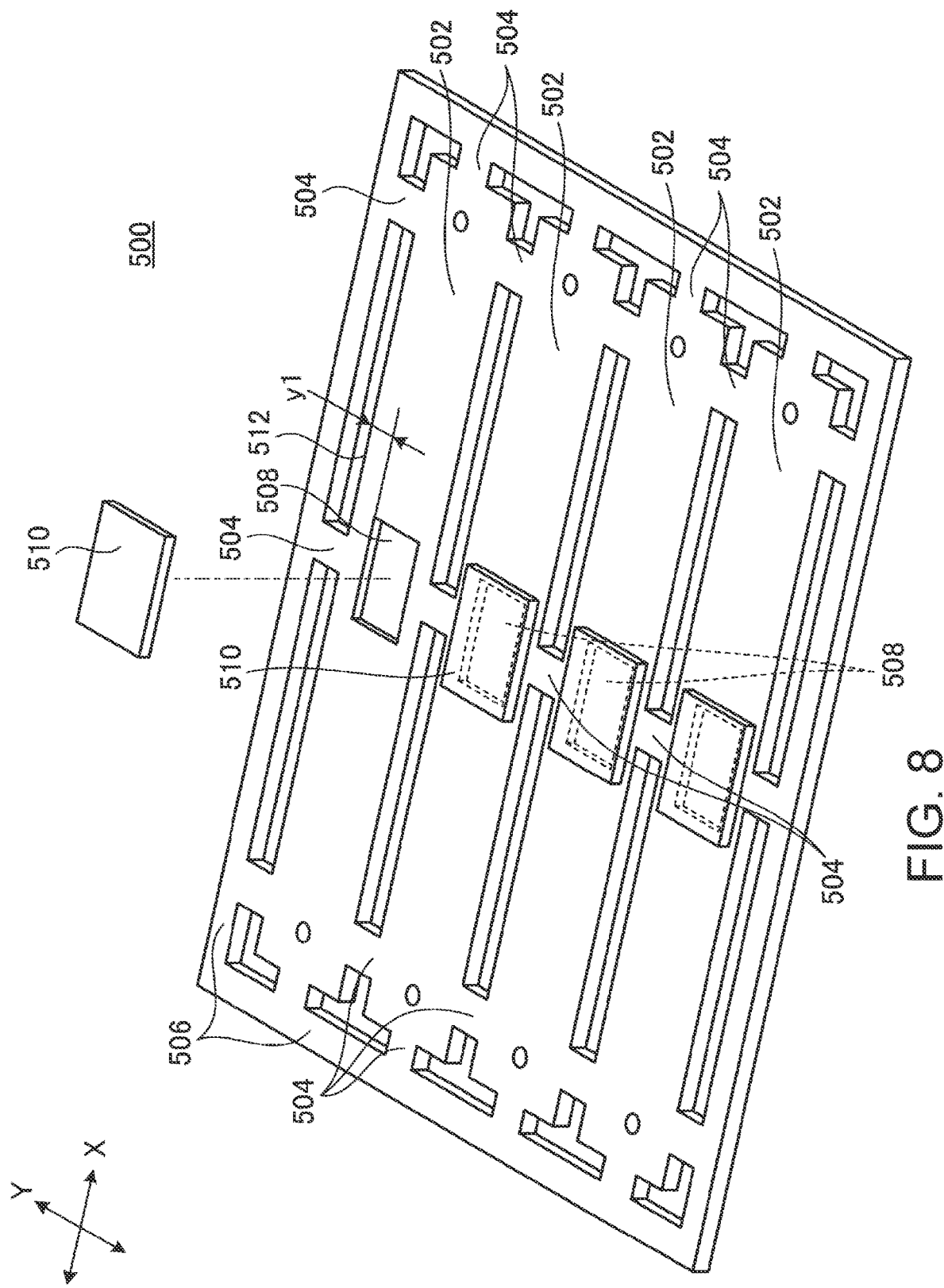
FIG. 8 is a perspective view of a panel and a PCB according to a prior art.

When PCBs are mass-produced, in some cases, a plurality of PCBs are manufactured from a single panel for the purpose of efficient manufacture. As illustrated in FIG. 8, for example, a plurality of PCBs may be formed on a panel. The PCBs may be connected to frame bodies or other adjacent PCBs by a plurality of stays. Bottomed cavities are formed in the PCBs, and components are mounted in the cavities. After the components are mounted, the components are subjected to a heating process and then soldered. Further, the stays are separated off, and the PCBs are obtained. Each of the PCBs may have, for example, a rectangular shape that is long in an X-direction and short in a Y-direction.

Figure 9:
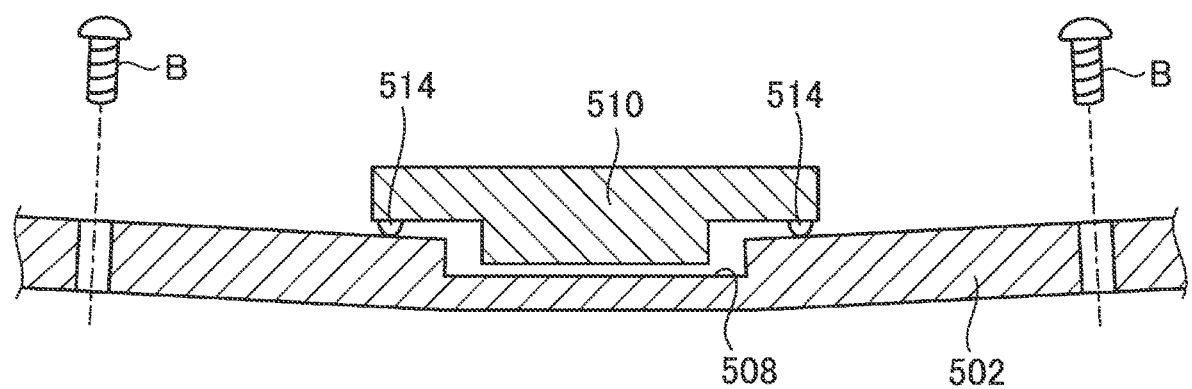
FIG. 9 is a sectional side view of the PCB according to the prior art.

Meanwhile, the PCBs are required to be even shorter in the Y-direction to make the PCBs smaller. This will cause a dimension y1 between each of the cavities and a Y-direction end to be considerably smaller. If the heating process is carried out in this state, then the cavity and the area around the cavity will be affected by heat. Further, when the stays are removed or screws are tightened against the PCB, the PCBs may be inconveniently deformed around the cavity, causing an electrode to rise, as illustrated in FIG. 9.

The present invention has been made with a view toward solving the above-mentioned problems, and to provide a panel, a PCB, and a manufacturing method for a PCB which make it possible to prevent the deformation of a PCB provided even with a cavity and also to achieve a size reduction.

In one example, a panel according to the first aspect of the present invention is a panel including one or more PCBs connected to frame bodies or other adjacent PCBs by a plurality of stays, wherein a cavity is formed in a surface of each of the PCBs, and among the stays, one provided in a first direction in which the distance to a side surface of the PCB is shorter as observed from the cavity is defined as a cavity stay, and the cavity stay includes extended lines formed by extending both ends in a second direction, which is orthogonal to the first direction in the cavity, and the length thereof in the second direction is greater than the cavity.

Each of the cavity stays may have the length thereof in the second direction set to be equal to or less than three times the cavity.

The cavity stays may be provided one each on both sides in the first direction, as observed from the cavity.

A manufacturing method for a PCB according to the second aspect of the present invention includes: a heating step of reflow soldering by heating the panel and an electronic component provided in at least the cavity; and a cutting step of cutting the stays.

Further, a PCB according to the third aspect of the present invention is a PCB with a cavity formed in a surface thereof, and has the mark of a stay that has been separated from a panel, the mark being located on a side surface in the first direction, the distance of which from the cavity is shorter, and the mark of the stay includes extended lines obtained by extending, in the first direction, both ends in a second direction, which is orthogonal to the first direction, in the cavity, and is longer than the cavity in the second direction.

In the panel according to the above-mentioned aspects of the present invention, if the direction in which the distance to the side surface of the PCB as observed from the cavity of the PCB is shorter is defined as the first direction, and the direction that is orthogonal to the first direction is defined as the second direction, then the cavity stay includes the extended lines obtained by extending, in the first direction, both ends in the second direction in the cavity, and the length thereof in the second direction is set to be greater than the cavity. This arrangement strengthens the area around the cavity that includes the extended lines, thus making it possible to prevent the deformation attributable to the influences of heat in the heating process. Further, the deformation of the PCB according to the above-mentioned aspect manufactured by the manufacturing method according to the above-mentioned aspect is prevented, thus enabling a further reduced length in the first direction with a resultant size reduction.

The following will describe in detail the embodiments of a panel, a PCB (Printed Circuit Board), and a manufacturing method for a PCB according to the present invention with reference to the accompanying drawings. It should be noted that the present invention is not limited by the embodiments.

Figure 1:
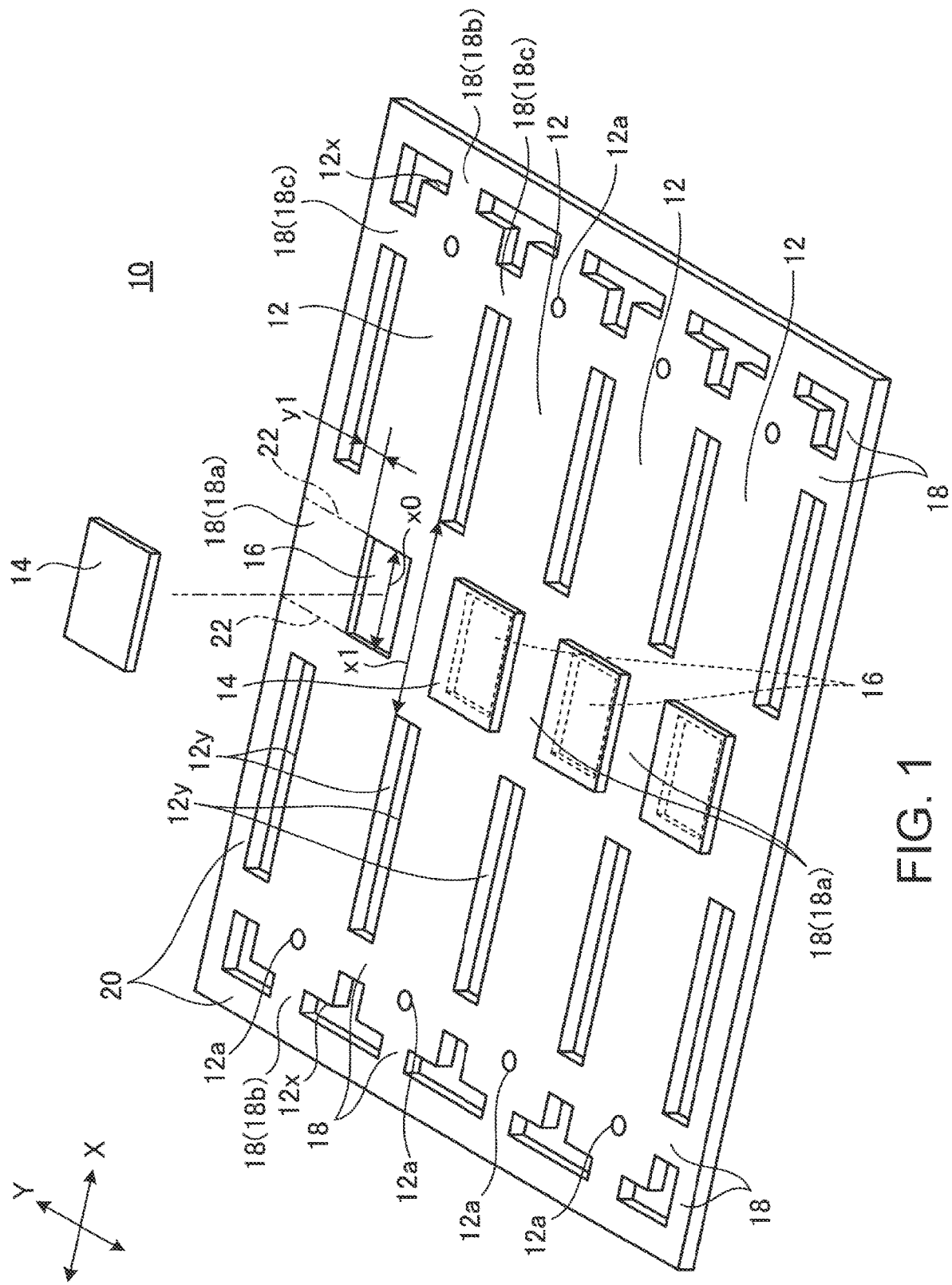
FIG. 1 is a perspective view of a panel and PCBs according to an embodiment.

FIG. 1 is a perspective view illustrating a panel 10 and PCBs 12, which are the embodiments of the present invention. Four PCBs 12 are to be cut out from the single panel 10 to efficiently mass-produce the PCBs 12. Although a plurality of pieces of the PCBs 12 are usually cut out from the single panel 10, one piece may be cut out, depending on conditions.

Each of the PCBs 12 has a rectangular shape that is long in an X-direction (a second direction) and short in a Y-direction (a first direction). The four PCBs 12 are arranged in the Y-direction. The dimension of each of the PCBs 12 in the Y-direction is especially short, thus making it possible to reduce the size of the PCB 12 and to provide more PCBs 12 on the single panel 10. Each of the PCBs 12 has a core layer and a plurality of circuit layers. Each of the PCBs 12 is provided with screw holes 12a.

In the surface of each of the PCBs 12, a cavity 16 is provided at a portion where a component 14 is to be mounted. Although many components are supposed to be mounted on each of the PCBs 12, only the component 14 corresponding to the cavity 16 is representatively illustrated in the present application. Further, in the present application, the PCB 12 will be referred to by the same designation regardless of before or after the mounting of the component 14 so as to prevent complication. The cavity 16 is a rectangular, bottomed hole, but does not necessarily have to be rectangular. The dimension of the PCB 12 in the Y-direction is short, so that a dimension y1 between a side surface 12y in the Y-direction and the cavity 16 is considerably small.

The PCBs 12 are connected to frame bodies 20 or other adjacent PCBs 12 by a plurality of short stays 18. The stays 18 are referred to also as bridges or tabs. The frame bodies 20 are the portions that form the four sides of the panel 10. The stays 18 extend in the X-direction from a X-direction side surface 12x and also extend in the Y-direction from each Y-direction side surface 12y in the vicinity of both ends in the X-direction. Further, the stays 18 are provided also at the Y-direction side surfaces 12y on both sides, as observed from the cavities 16. In the present application, the stays 18 will be referred to as cavity stays 18a.

The cavity stays 18a refer to the stays in a first direction (the Y-direction in FIG. 1), the distances of which to the side surfaces of the PCBs 12 as observed from the cavities 16 are short, excluding the stays in a second direction (the X-direction in FIG. 1), the distances of which to the side surfaces of the PCBs 12 as observed from the cavity 16 are long (stays 18b in FIG. 1), and the stays which are present at the Y-direction side surfaces 12y but absent in the first direction as observed from the cavities 16 (stays 18c in FIG. 1). The PCBs 12 are connected to the frame bodies 20 at the four sides in a balanced manner by a plurality of stays 18, including the cavity stays 18a.

Figure 2:
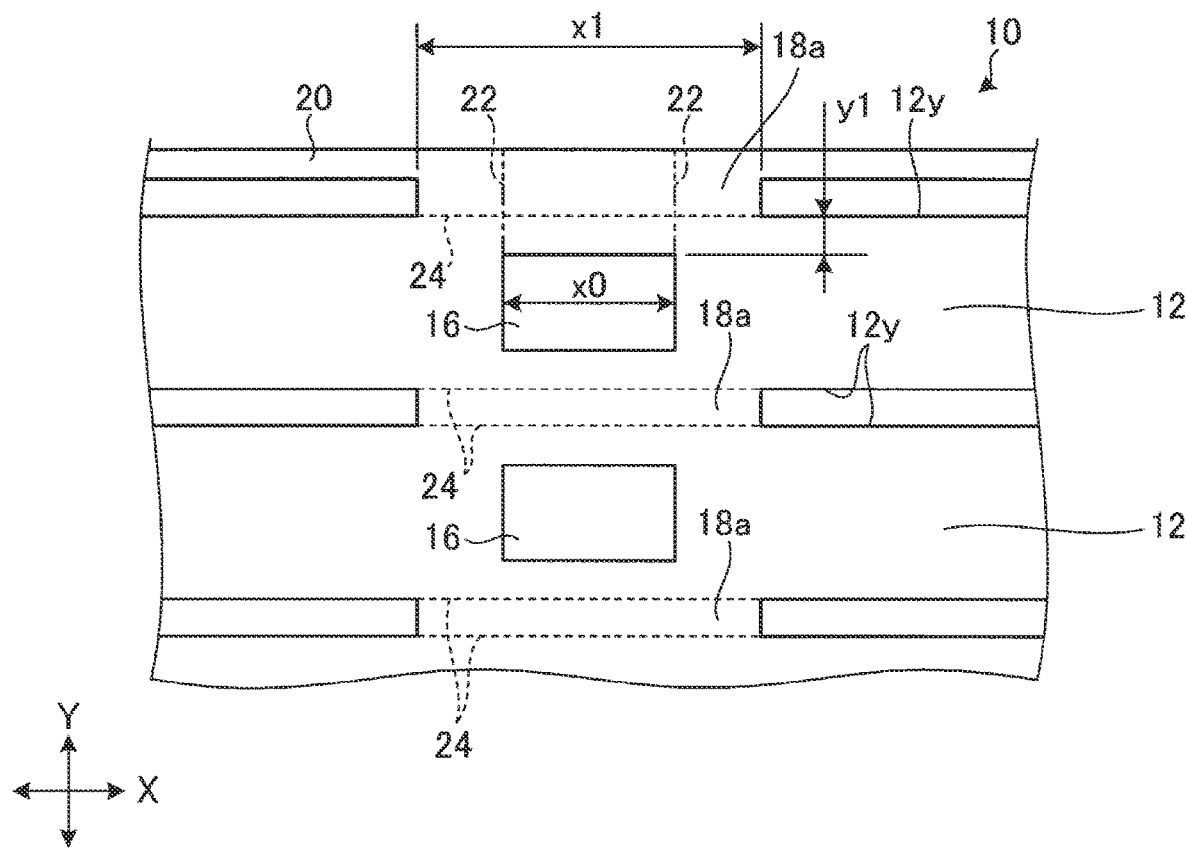
FIG. 2 is a partially enlarged plan view of the panel and the PCBs according to the embodiment.

As illustrated in FIG. 2, each of the cavity stays 18a includes extended lines 22 obtained by extending, in the Y-direction, both ends found in the X-direction in the cavity 16. Further, a length x1 of the cavity stay 18a in the X-direction is set to be longer than a length x0 of the cavity 16 in the X-direction and equal to or smaller than four times the length x0. This arrangement enables the areas around the cavities 16 to be firmly supported in relation to the frame bodies 20 or other adjacent PCBs 12, thus making it possible to reduce the influences of heat in a heating process, which will be discussed hereinafter. The cavity stays 18a will be cut off at cutoff lines 24 along the side surfaces of the PCBs 12 after the heating process. Since the length x1 of each of the cavity stays 18a in the X-direction is set to be equal to or smaller than four times the length x0 of the cavity 16, the time for a cutting process can be shortened and the life of a cut-off tool can be prolonged. Further, setting the length x1 to four times the length x0 can sufficiently reduce the influences of heat in the heating process, and the effect remains substantially unchanged even if the length x1 is set to be four times or more.

Considering the supporting strength and the reduction of the time of the cutting process, the length x1 is set to be double the length x0 in the panel 10. The length x1 of the cavity stay 18a may be adjusted according to the depth of the cavity 16 or the dimension y1. In FIG. 1, FIG. 2, FIG. 6 and FIG. 7, the extended lines 22 are indicated by chain double-dashed lines, and the cutoff lines 24 are indicated by dashed lines.

A description will now be given of a PCB manufacturing method for manufacturing the PCBs 12 from the panel 10 configured as described above.

First, the panel 10 illustrated in FIG. 1 is formed. As described above, the panel 10 has the shape in which the four PCBs 12 are connected by the stays 18 to the frame bodies 20 or the adjacent PCBs 12. At this stage, however, the components 14 are neither mounted on the PCBs 12 nor formed in the cavities 16.

Figure 4:
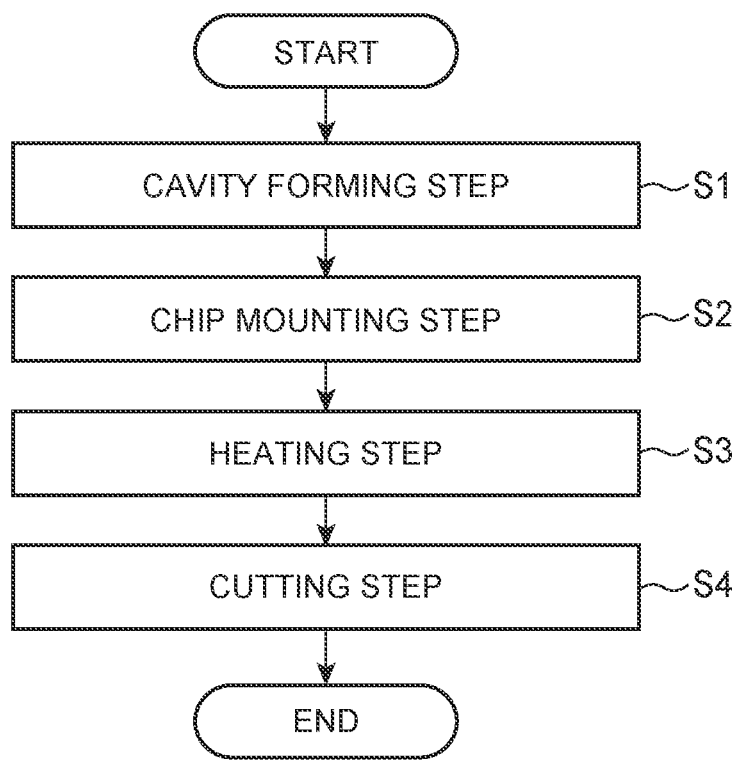
FIG. 4 is a flowchart of the manufacturing method of the PCB according to the embodiment.

Next, as illustrated in FIG. 4, the cavity 16 is formed in each of the PCBs 12 in a step S1, namely, a cavity forming step. In the portion of the cavity 16, the inter-adhesive agent of circuit layers is omitted. The portion corresponding to the outer periphery of the cavity 16 is scraped off to an appropriate depth by a router, laser or the like, and the central portion is torn off, thereby forming the cavity 16.

Figure 3:
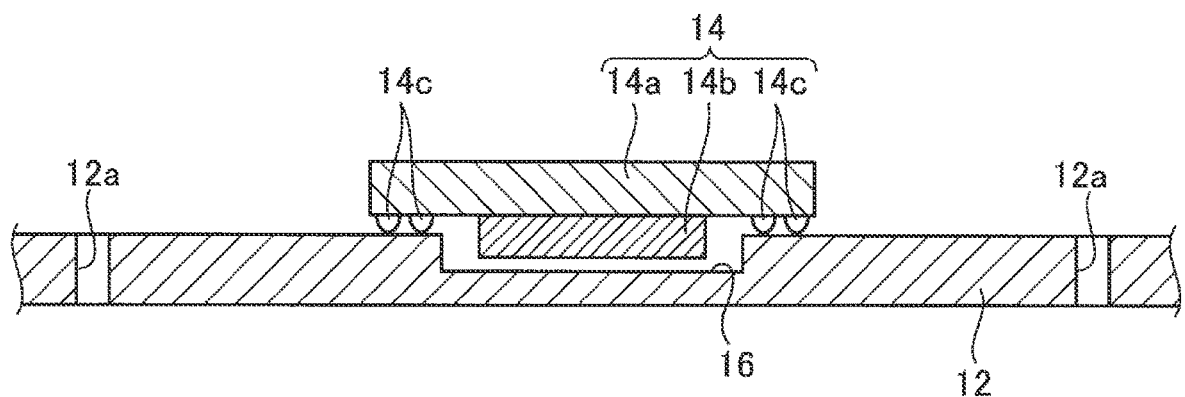
FIG. 3 is a sectional side view of the PCB according to the embodiment.

Further, solder cream is applied to required locations, and then the components 14 are mounted in the portions of the cavities 16 in a step S2, namely, a chip mounting step. As illustrated in FIG. 3, each of the components 14 includes, for example, a CPU (electronic component) 14*a* and a capacitor 14*b* provided on the lower surface of the CPU 14*a*, and electrodes 14*c* are provided around the cavity 16. The capacitor 14*b* is placed in the cavity 16, thereby making it possible to reduce the projection height from the surface of the PCB 12 of the component 14. In addition, the cavity 16 has a closed bottom, thus preventing the electromagnetic noise from the CPU 14*a* from being released downward. It would be further preferable to provide a conductive layer on the bottom of the cavity 16 to shield the electromagnetic noise of the CPU 14*a*. Although not illustrated, a heatsink, for example, may be used, other than an electronic component, as the component 14. The heatsink may be brought into contact with the bottom surface of the cavity 16 to release the heat of the PCB 12.

Subsequently, the panel 10 is placed and heated in a heating furnace (e.g. a reflow furnace) in a step S3, namely, a heating step. Thus, the electrodes 14*c* are reflow-soldered to the circuit pattern of the PCB 12.

At this time, although the dimension y1 between the Y-direction side surface 12*y* of the PCB 12 and the cavity 16 (refer to FIG. 2) is considerably small, the length x1 of the cavity stay 18*a* is set to be double the length x0 of the cavity 16 in the X-direction, so that the influences of heating are minimized. In particular, the portion of the extended lines 22 (refer to FIG. 2) where the influence of heating is the greatest is included in the cavity stay 18*a*, thus making it possible to reduce the deformation of this portion.

Subsequently, after the panel 10 is cooled, the stay 18 is cut along the cutoff lines 24 thereby to cut off the four PCBs 12 from the panel 10 in a step S4, namely, a cutting step. At this time, since the length x1 of the cutoff lines 24 is set to be double the length x0 of the cavity 16 in the X-direction, the cutting off can be accomplished in a shorter time. In the cutting step, the stays 18 other than the cavity stays 18*a* are also cut.

Figure 5:
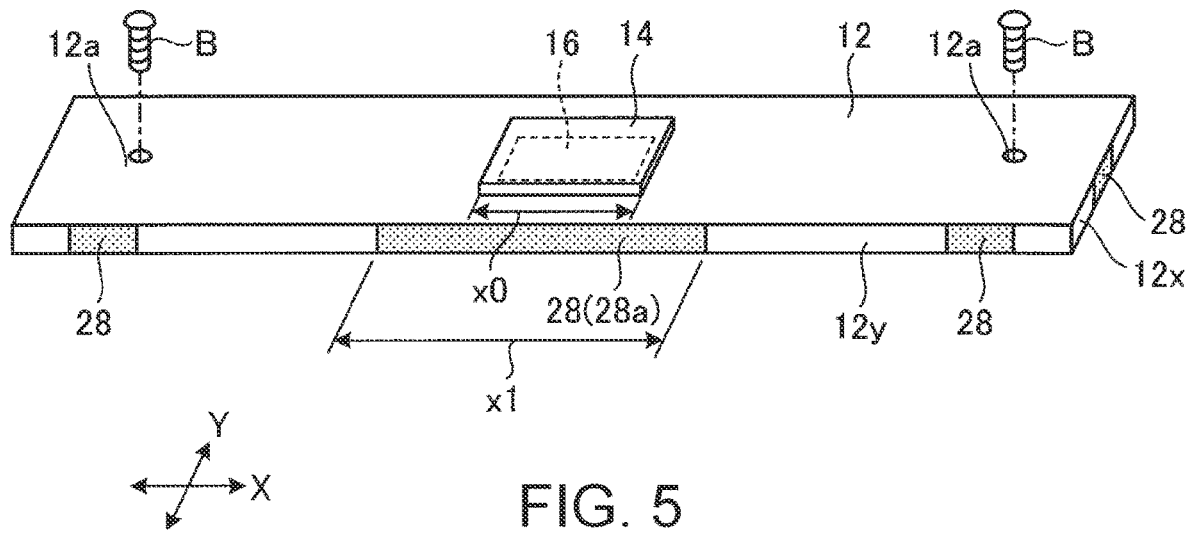
FIG. 5 is a perspective view of the PCB according to the embodiment.

As illustrated in FIG. 5, the PCB 12 manufactured as described above maintains the planar plate shape with no distortion in the area around the cavity 16. Therefore, the electrodes 14*c* (refer to FIG. 3) will not rise from the circuit pattern or will not be subjected to stress. In addition, tightening by screws B to a post through screw holes 12*a* will not cause stress to be applied to the PCBs 12 themselves, thus preventing the shortening of the lives thereof.

In the PCBs 12 manufactured as described above, stay marks 28 that are visible exist in the places where the stays 18 and the cavity stays 18*a* were provided. In particular, the side surface 12*y* (in the Y-direction observed from the cavity 16) has a stay mark 28*a* of the cavity stay 18*a* that has been cut off from the panel 10. The position where the cavity stay 18*a* was provided and the length thereof are recognized by the length x1, thus enabling the stay mark 28*a* to be used as a means for checking or assuring the quality. In FIG. 5, the stay marks 28 are indicated by the dotted area.

A description will now be given of the modification examples of the panel 10 with reference to FIG. 6 and FIG. 7. In each modification example, the like constituent elements as those of the panel 10 and the PCB 12 will be denoted by like reference numerals, and the detailed descriptions thereof will be omitted.

Figure 6:
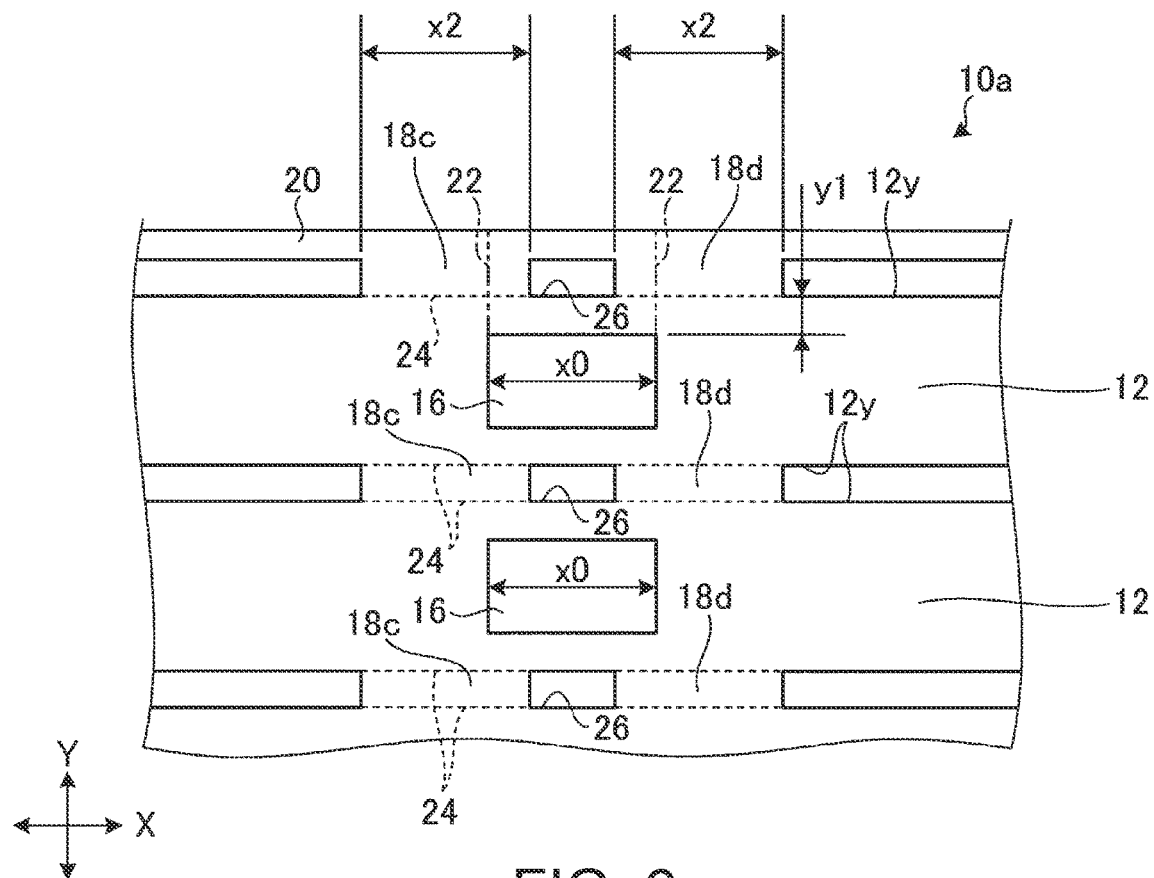
FIG. 6 is a partially enlarged plan view of a panel and a PCB according to a first modification example.

FIG. 6 is a partially enlarged plan view of a panel 10*a* according to a first modification example. As illustrated in FIG. 6, in the panel 10*a*, each of cavities 16 has two cavity stays, 18*c* and 18*d*, one each, on Y-direction side surfaces 12*y* of each of the PCBs 12. The two cavity stays 18*c* and 18*d* replace the foregoing single cavity stay 18*a*. This means that, if, for some reason, it becomes necessary to provide a hole 26 in the vicinity of the side surface 12*y* in the Y-direction of the PCB 12 as observed from the cavity 16, then the single cavity stay 18*a* will be replaced by the two (or three or more) cavity stays 18*c* and 18*d*. Although there are no restrictions on the shape of the holes 26, the holes 26 are preferably shorter in the X-direction rather than longer in the X-direction. Further, if there is no particular need for providing the holes 26, then it is more desirable to provide the cavity stays 18*a* one each on the side surfaces 12*y* in the Y-direction on both sides, as observed from the cavity 16, as described above from the viewpoint of the prevention of the distortion than it is to provide the two or more cavity stays 18*d*

In this case also, preferably, each of the cavity stays 18*d* includes extended lines 22, and the total of the lengths x2 in the longitudinal direction (i.e., x2 times two) is set to be greater than a length x0 of the cavity 16 in the X-direction and equal to or less than four times the length x0.

Figure 7:
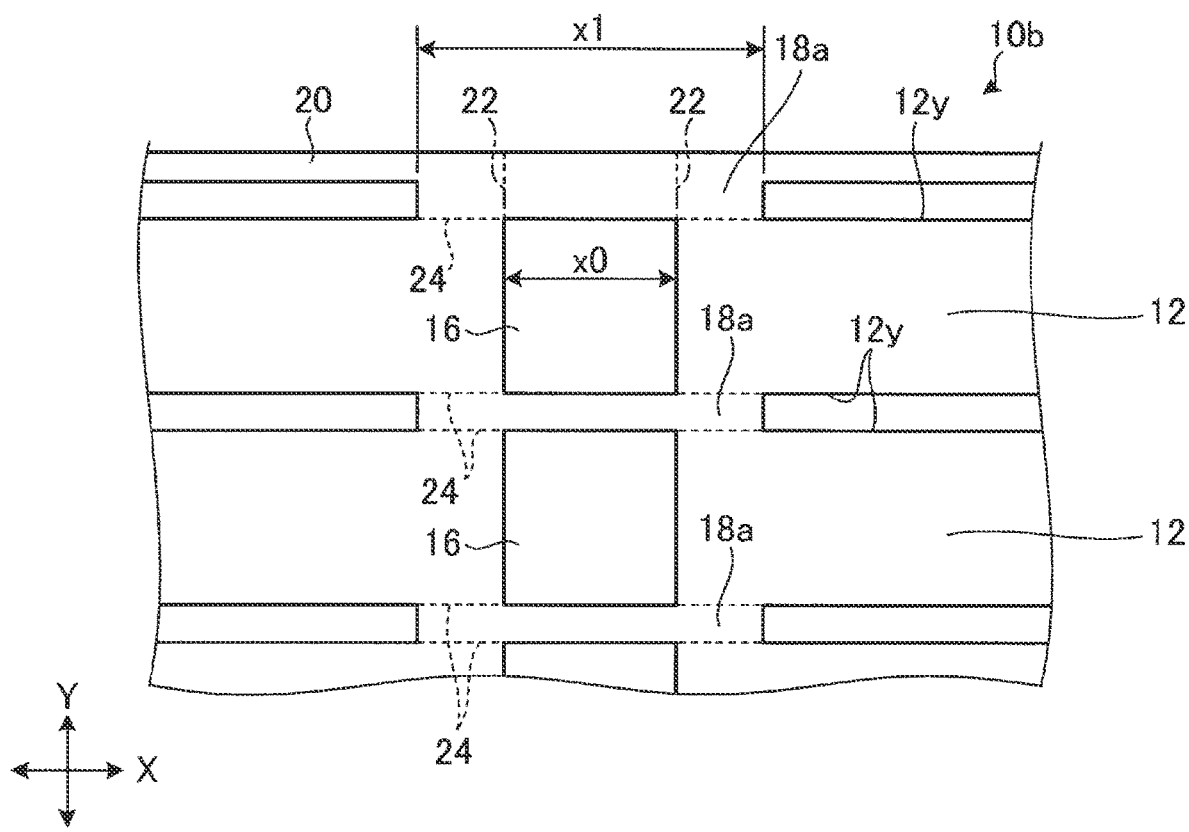
FIG. 7 is a partially enlarged plan view of a panel and a PCB according to a second modification example.

FIG. 7 is a partially enlarged plan view of a panel 10*b* according to a second modification example. As illustrated in FIG. 7, in the panel 10*b*, the lengths of each of the PCBs 12 and cavities 16 in the Y-direction are equal. More specifically, the foregoing y1 (refer to FIG. 2) is zero. In the PCBs 12 obtained from the panel 10*b*, the portions of the cavities 16 are formed to be flexible, so that the PCBs 12 can be bent at the cavities 16, enabling the PCBs 12 to be handled like flexible printed circuit boards. In this case, there is no need to provide components 14 in the cavities 16.

Further, in the case where the obtained PCBs 12 are used by being bent at the cavities 16, it is not preferable that the PCBs 12 be distorted before use. Hence, the distortion of the PCBs 12 is desirably prevented in the manufacturing stage by cavity stays 18*a* having the foregoing appropriate length x1.

As described above, in the panels 10, 10*a* and 10*b* according to the present embodiments, when the Y-direction in which the distance to the side surface of the PCB 12 as observed from the cavity 16 of the PCB 12 is defined as the first direction, and the X-direction that is orthogonal to the Y-direction is defined as the second direction, the cavity stay 18*a* includes the extended lines 22 obtained by extending in the first direction both ends of the cavity 16 found in the second direction, and the length x1 in the second direction is set to be greater than the length x0 of the cavity 16. Thus, the area around the cavity 16 including the extended lines 22 is strengthened, making it possible to prevent the deformation caused by the influences of heat in the heating step. The portion of the extended lines 22 in particular is considered to be significantly influenced by heat, so supporting the portion by the cavity stay 18*a* is effective for preventing thermal deformation. Further, the PCBs 12 manufactured from the foregoing panels 10, 10*a* and 10*b* by the foregoing manufacturing method are immune to deformation, thus making it possible to further reduce the dimension in the first direction with a resultant further reduction in size.

The present invention is not limited to the embodiments described above, and can obviously be altered freely within a range that does not deviate from the spirit of the present invention.

DESCRIPTION OF SYMBOLS 10, 10a, 10b panel
12 PCB
12x X-direction side surface
12y Y-direction side surface
14 component
16 cavity
18 stay
18a, 18c, 18d cavity stay
20 frame body
22 extended line
24 cutoff line
26 hole
28, 28a stay mark Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A printed circuit board (PCB) panel, comprising
a frame body;
a plurality of stays;
at least one cavity stay;
a plurality of openings; and
a PCB coupled to the frame body via the plurality of stays extending outwards from at least a first side surface and a second side surface and the at least one cavity stay extending outwards from at least a third side surface of the PCB, the PCB including a first length in an x-direction and a second length in a y-direction that is less than the first length in the x-direction and the PCB comprising a cavity formed in a top surface of the PCB and configured to house an electronic component,
wherein:
the cavity includes a third length in the x-direction and a fourth length in the y-direction,
the first side surface of the PCB extends in the y-direction and is substantially perpendicular relative to the third length of the cavity,
the second side surface of the PCB extends in an x-direction and is substantially parallel relative to the fourth length of the cavity,
the third side surface of the PCB extends in the y-direction, is substantially perpendicular relative to the third length of the cavity, and is located opposite the first side surface,
a first stay in the plurality of stays extends in the y-direction and is created between a first opening and a second opening in the plurality of openings located on the first side surface,
a second stay in the plurality of stays extends in the y-direction, is created between a third opening and a fourth opening located on the third side surface, and is located opposite the first stay,
the first opening in the plurality of openings includes a first portion including a fifth length extending in the x-direction along the second side surface and a second portion including a sixth length extending in the y-direction along the first side surface,
the second opening in the plurality of openings includes a third portion including a seventh length extending in the y-direction along the first side surface,
the third opening in the plurality of openings includes a fourth portion including an eighth length extending in the x-direction along the second side surface and a fifth portion including a ninth length extending in the y-direction along the third side surface,
the fourth opening in the plurality of openings includes a sixth portion including a tenth length extending in the y-direction along the third side surface, and
the at least one cavity stay includes an eleventh length that extends continuously along the second side surface in the x-direction beginning from a first point outside a first edge of the cavity to a second point ending outside a second edge of the cavity that is opposite the first edge of the cavity.

2. The PCB panel of claim 1, wherein the eleventh length of the at least one cavity stay is in the range of two times the third length of the cavity and four times the third length of the cavity.

3. The PCB panel of claim 1, further comprising a second cavity stay provided opposite the at least one cavity stay, wherein the second cavity stay extends in the x-direction along a fourth side of the PCB.

4. The PCB panel of claim 1, wherein the PCB further comprises the electronic component located in the cavity.

5. The PCB panel of claim 1, further comprising at least one additional PCB coupled to the frame body and any adjacent PCB via at least one of the plurality of stays.

6. The PCB panel of claim 2, wherein the eleventh length of the at least one cavity stay is approximately two times the third length of the cavity.

7. The PCB panel of claim 1, wherein the eleventh length of the at least one cavity stay is adjusted based on a depth of the cavity.

8. The PCB panel of claim 1, wherein the eleventh length of the at least one cavity stay is adjusted based on a distance in the y-direction between the cavity and the at least one cavity stay.

9. A printed circuit board (PCB), comprising:
a cavity formed in a top surface of the PCB and configured to house an electronic component; and
a connection point configured to connect the PCB to a first cavity stay of a PCB panel, the PCB including a first length in an x-direction and a second length in a y-direction that is less than the first length and the first cavity stay being located near the cavity,
wherein:
the cavity includes a third length in the x-direction and a fourth length in the y-direction,
the connection point is located on a first side surface of the PCB,
a second side surface of the PCB extends in the y-direction and is substantially perpendicular relative to the cavity,
the first side surface extends in the x-direction and is substantially parallel relative to the cavity,
the connection point includes a fifth length in the x-direction extending along the first side surface that is greater than the third length of the cavity in the x-direction,
the connection point extends continuously along the first side surface in the x-direction beginning from a first point outside a first edge of the cavity to a second point ending outside a second edge of the cavity that is opposite the first edge of the cavity, and
the first cavity stay is created between a first opening extending in the x-direction along the first side surface and a second opening extending in the x-direction along the first side surface.

10. The PCB of claim 9, further comprising the electronic component located in the cavity.

11. The PCB of claim 9, wherein the fifth length of the connection point is in the range of two times the third length of the cavity and four times the third length of the cavity.

12. The PCB of claim 11, wherein the fifth length of the connection point is approximately two times the third length of the cavity.

13. The PCB of claim 9, wherein the third length of the connection point is adjusted based on a depth of the cavity.

14. The PCB of claim 9, wherein the fifth length of the connection point is adjusted based on a distance in the y-direction between the cavity and the first cavity stay.

15. The PCB of claim 9, wherein
the connection point is a first connection point; and
the PCB further comprises a second connection point configured to connect the PCB to a second cavity stay provided opposite the first cavity stay relative to the cavity.

16. A printed circuit board (PCB) panel, comprising
a frame body;
a first cavity stay;
a second cavity stay;
a first PCB coupled to the frame body via the first cavity stay; and
a second PCB coupled to the frame body via the second cavity stay,
wherein:
the first PCB and the second PCB each includes a first length in an x-direction and a second length in a y-direction that is less than the first length,
the first PCB comprises a first cavity formed in a first top surface of the first PCB and configured to house a first electronic component,
the second PCB comprises a second cavity formed in a second top surface of the second PCB and configured to house a second electronic component,
the first cavity and the second cavity each includes a third length in the x-direction and a fourth length in the y-direction,
the first cavity stay extends in the x-direction and is created between a first opening extending in the x-direction along the first length of the first PCB and a second opening extending in the x-direction along the first length of the first PCB,
the second cavity stay extends in the x-direction and is created between a third opening extending in the x-direction along the first length of the second PCB and a fourth opening extending in the x-direction along the first length of the second PCB and is positioned in the y-direction relative to the first cavity stay,
each of the first cavity stay and the second cavity stay includes a fifth length in the x-direction that is greater than each third length of the first cavity and the second cavity in the x-direction,
the first cavity stay extends continuously in the x-direction along the first length of the first PCB beginning from a first point outside a first edge of the first cavity to a second point ending outside a second edge of the first cavity that is opposite the first edge of the first cavity, and
the second cavity stay extends continuously in the x-direction along the first length of the second PCB beginning from a third point outside a third edge of the second cavity to a fourth point ending outside a fourth edge of the second cavity that is opposite the third edge of the second cavity.

17. The PCB panel of claim 16, wherein each respective fifth length of the first cavity stay and the second cavity stay is in the range of two times and four times each respective third length of the first cavity and the second cavity.

18. The PCB panel of claim 17, wherein each respective fifth length of the first cavity stay and the second cavity stay is approximately two times each respective third length of the first cavity and the second cavity.

19. The PCB panel of claim 16, wherein:
the fifth length of the first cavity stay is adjusted based on a first depth of the first cavity; and
the fifth length of the second cavity stay is adjusted based on a second depth of the second cavity.

20. The PCB panel of claim 16, wherein:
the fifth length of the first cavity stay is adjusted based on a first distance in the y-direction between the first cavity and the first cavity stay; and
the fifth length of the second cavity stay is adjusted based on a second distance in the y-direction between the second cavity and the second cavity stay.

* * * * *